(12) United States Patent
Khakifirooz et al.

(10) Patent No.: US 12,339,742 B2
(45) Date of Patent: Jun. 24, 2025

(54) SOFT READ OPERATIONS WITH PROGRESSIVE DATA OUTPUT

(71) Applicant: Intel Corporation, Santa Clara, CA (US)

(72) Inventors: Ali Khakifirooz, Brookline, MA (US); George Kalwitz, Mead, CO (US); Anand Ramalingam, Portland, OR (US); Ravi Motwani, Fremont, CA (US); Renjie Chen, Santa Clara, CA (US)

( * ) Notice: Subject to any disclaimer, the term of this patent is extended or adjusted under 35 U.S.C. 154(b) by 849 days.

(21) Appl. No.: 17/342,993

(22) Filed: Jun. 9, 2021

(65) Prior Publication Data

US 2021/0294698 A1 Sep. 23, 2021

(51) Int. Cl.
| | |
|---|---|
| *G06F 11/10* | (2006.01) |
| *G11C 11/56* | (2006.01) |
| *G11C 16/04* | (2006.01) |
| *G11C 16/26* | (2006.01) |
| *H03M 13/45* | (2006.01) |

(52) U.S. Cl.
CPC ...... *G06F 11/1068* (2013.01); *G06F 11/1012* (2013.01); *G11C 11/5642* (2013.01); *G11C 16/0483* (2013.01); *G11C 16/26* (2013.01); *H03M 13/458* (2013.01)

(58) Field of Classification Search
CPC ............. G06F 11/1068; G06F 11/1012; G11C 11/5642; G11C 11/5671; G11C 16/0483; G11C 16/26; G11C 7/1066; G11C 7/062; G11C 7/1015; G11C 7/12; G11C 7/22; G11C 16/24; G11C 2029/0411; G11C 2207/002; G11C 2207/2272; G11C 2211/5631; G11C 29/52; G11C 16/10;
(Continued)

(56) References Cited

U.S. PATENT DOCUMENTS 9,293,210 B2 * 3/2016 Jang .................... G11C 11/5628
9,811,269 B1 11/2017 Ramalingam et al.
(Continued)

OTHER PUBLICATIONS

M. N. Kaynak, P. R. Khayat and S. Parthasarathy, "Classification Codes for Soft Information Generation from Hard Flash Reads," in IEEE Journal on Selected Areas in Communications, vol. 32, No. 5, pp. 892-899, May 2014, (Year: 2014).*
(Continued)

*Primary Examiner* — Cynthia Britt
(74) *Attorney, Agent, or Firm* — Haley Guiliano LLP

(57) ABSTRACT

Systems, apparatuses and methods may provide for memory controller technology including first logic to trigger, via an initial request, a hard-read and a soft-read, wherein the hard-read is to generate hard-bit information and the soft-read is to generate first soft-bit information and second soft-bit information, conduct a first error correction on the hard-bit information, and issue a subsequent request for at least the second soft-bit information if the first error correction is unsuccessful. Additionally, memory device technology may include a plurality of memory cells and second logic to conduct the hard-read and the soft-read from a memory cell in the plurality of memory cells in response to the initial request, send the hard-bit information to the controller, and withhold at least the second soft-bit information from the controller until the subsequent request is received.

18 Claims, 6 Drawing Sheets

(58) Field of Classification Search
CPC .......... H03M 13/458; H03M 13/3707; H03M 13/6325; H03M 13/1108; H03M 13/1111
See application file for complete search history.

(56) References Cited

U.S. PATENT DOCUMENTS

| | | | |
|---|---|---|---|
| 10,163,500 B1* | 12/2018 | Yu | G06F 11/1072 |
| 10,474,525 B2* | 11/2019 | Sharon | G06F 11/1048 |
| 10,733,047 B2* | 8/2020 | El Gamal | G11C 16/26 |
| 10,832,766 B2 | 11/2020 | Khakifirooz et al. | |
| 11,029,889 B1 | 6/2021 | Sharon et al. | |
| 2013/0024743 A1* | 1/2013 | Sharon | G11C 7/1006 |
| | | | 714/763 |
| 2013/0294157 A1 | 11/2013 | Sharon et al. | |
| 2017/0123902 A1 | 5/2017 | Ravimohan et al. | |
| 2018/0253353 A1 | 9/2018 | Takase | |
| 2019/0043589 A1 | 2/2019 | Kwok et al. | |
| 2019/0130982 A1 | 5/2019 | Reusswig et al. | |

OTHER PUBLICATIONS

Office Action issued for Dutch Application No. 2031797, Feb. 22, 2023, 8 pages.

* cited by examiner

SOFT READ OPERATIONS WITH PROGRESSIVE DATA OUTPUT

TECHNICAL FIELD

Embodiments generally relate to memory structures. More particularly, embodiments relate to soft read operations with progressive data output from memory devices.

BACKGROUND

In solid state drives (SSDs), multi-level NAND-type flash memory ("NAND memory") may be organized into multiple cells, with each cell containing multiple bits of data. In such a case, the number of bits per cell may depend on how many distinct voltage levels can be achieved during program operation(s). For example, to support two bits per cell, four voltage levels may be called for in order to distinguish between the four possible combinations of ones and zeros (11, 01, 00, 10) in a cell. As the number of bits per cell increases, the ability to distinguish between "hard-bit" voltage read levels typically becomes more difficult. NAND memory devices may conduct read operations (reads) at additional voltage levels around the threshold voltage levels to obtain "soft-bit" information, where the soft-bit information may be used by a memory controller to conduct error correction code (ECC) operations.

While providing soft-bit information may increase the ECC capability of the controller, there remains considerable room for improvement. For example, conventional approaches to collecting soft-bit information may increase latency, which in turn has a negative impact on performance and quality of service (QOS). Additionally, the soft-bit information may be transferred to the memory controller over a data input/output (I/O) bus that is shared by multiple memory devices. As a result, delays may be encountered when transmitting the soft-bit information on the data I/O bus, which further reduces performance/QoS, and so forth.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

In multi-level cell (MLC) memory devices such as MLC NAND flash memory, cells are typically programmed into one of $2^N$ possible levels to store N bits of information. To read this data, a series of read operations at predetermined read levels (e.g., a subset of $2^N$-1 read levels) are performed.

Figure 1:
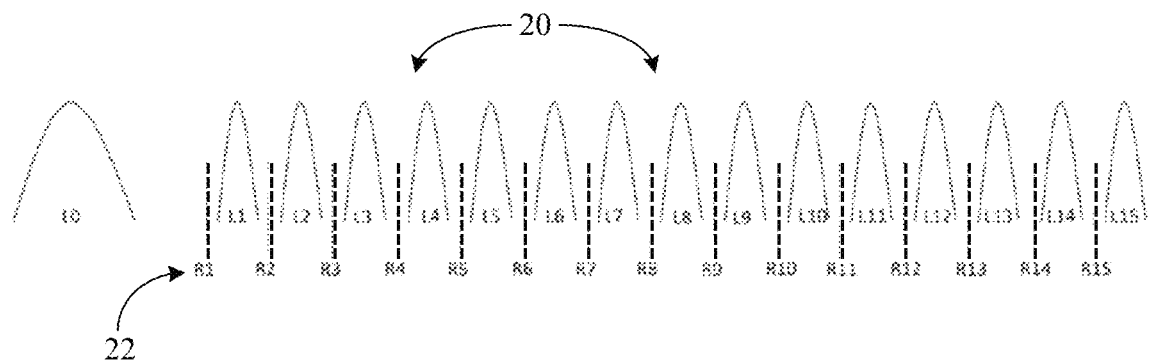
FIG. 1 is an illustration of an example of a plurality of hard-bit voltage read levels according to an embodiment.

For example, FIG. 1 demonstrates that in a quad-level cell (QLC) architecture, cells are programmed into sixteen encoding levels 20 ("L0" to "L15") to store four bits of information per cell. In one example, the cells are programmed (e.g., written to) and read on a page-by-page basis, with each page corresponding to a particular bit. To read the data, a series of read operations at a subset of read levels 22 ("R1" to "R15") are performed to reconstruct each of the four bits of information. In an embodiment, the read operations at the read levels 22 are considered "hard-reads" that generate "hard-bit" information. More particularly, each encoding level 20 may correspond to a four-bit combination depending on the encoding scheme used.

Thus, encoding level L1 might correspond to "0111", encoding level L2 may correspond to "0110", encoding level L7 might correspond to "0100", encoding level L8 may correspond to "0101", encoding level L13 might correspond to "1101", and encoding level L14 may correspond to "1100", with the rightmost bit (e.g., bolded Bit 4) corresponding to, for example, a lower page (LP). In such a case, if a hard-read at the read level R2 indicates that the cell is programmed to the encoding level L2, it may be determined that a one-to-zero transition has taken place with respect to Bit 4 and the lower page is being targeted.

In practice, since the encoding levels 20 are very closely placed, some error (e.g., raw bit error rate/RBER) occurs in reading the data. For example, in a QLC NAND, the RBER can be 1e-3 or higher. To overcome this issue, error correction schemes such as low density parity coding (LDPC) may be used. When the data is programmed, additional parity bits are constructed based on the error correction scheme and stored along with the information provided by the user application. Based on the number of parity bits and the details of the error correction coding, a calculation may be made of the maximum RBER that can be successfully corrected for a target uncorrected bit error rate (UBER). For example, in a state-of-the-art implementation, the ECC engine may be able to correct the data with a maximum RBER of 7e-3. In an embodiment, the error correction capability is improved by providing soft-bit information in addition to the hard-bit information. In this case, the memory device (e.g., NAND flash device) performs additional read operations in the vicinity of the default read levels 22 to provide a confidence level for each bit of the data.

Figure 2:
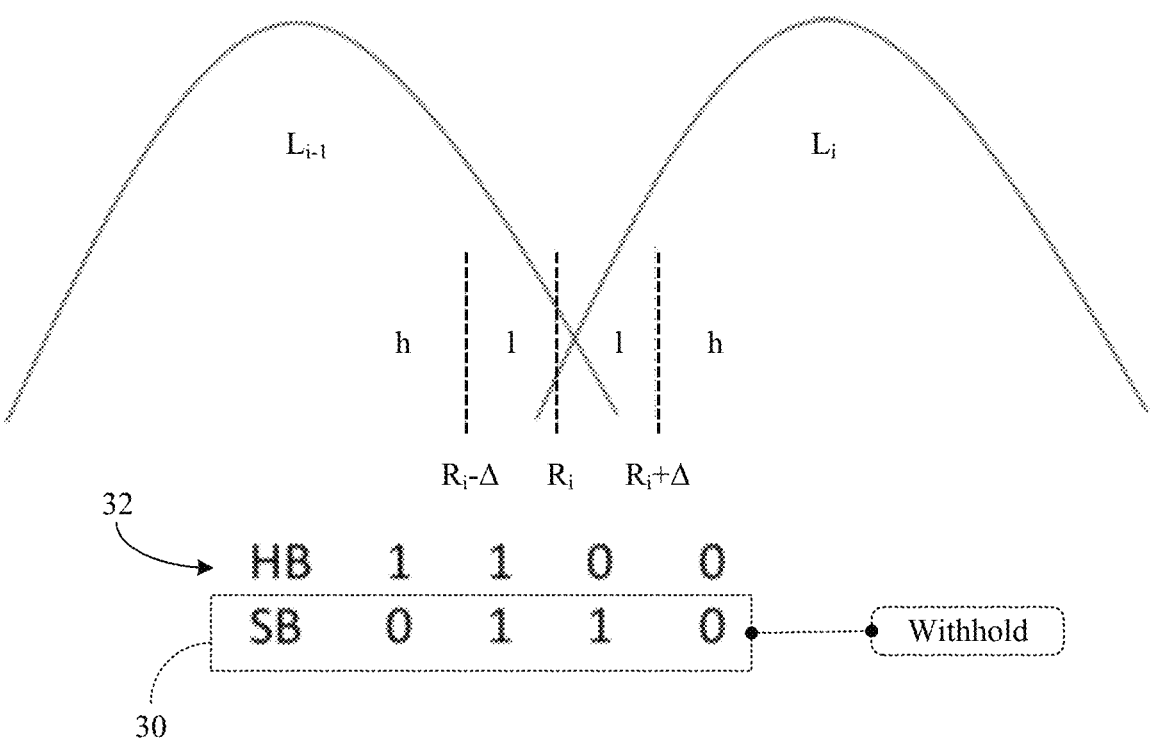
FIG. 2 is an illustration of an example of a 3-strobe soft-read according to an embodiment.

For example, FIG. 2 shows a 3-strobe soft-read for a read level $R_i$ in which one bit of soft-bit (SB) information 30 is generated by reading at two additional levels $R_i-\Delta$ and $R_i+\Delta$. The soft-bit information 30, which is generated in addition to hard-bit (HB) information 32, enables bits that are between $R_i-\Delta$ and $R_i+\Delta$ to be identified as low ("1") confidence bits. More particularly, if a soft-read at the level $R_i-\Delta$ indicates that the cell is programmed to the encoding level $L_i$, it may be determined that a low confidence transition has taken place with respect to the bit in question. Similarly, if a soft-read at the level $R_i+\Delta$ indicates that the cell is programmed to the encoding level $L_i$, it may be determined that a low confidence transition has taken place with respect to the bit in question. Otherwise, the hard-bit information 32 is considered to be a high ("h") confidence value. In an embodiment, an ECC engine/controller uses this extra information to increase the correction capability. For example, maximum RBER that can be corrected may increase to 1.3e-2 compared to a case where only HB information is used. In one example, the gap A is chosen to maximize the information, where a trade-off is made between sensitivity and specificity.

In the illustrated example, the memory device initially sends the hard-bit information 32 to the controller that initiated the reads and withholds the soft-bit information 30 from the controller. In such a case, the controller conducts a first error correction on the hard-bit information 32 and issues a subsequent request for the soft-bit information 30 only if the first error correction is unsuccessful. Initially generating but withholding the soft-bit information 30 enhances performance at least to the extent that traffic on the data I/O bus and/or latency are reduced. More particularly, in a memory system such as in an SSD, multiple memory devices (e.g., NAND flash devices), may share a data I/O bus. Thus, although while read operations can be performed concurrently on multiple memory devices, I/O operations may be delayed until the data bus is free. As such, the read latency is a function of the number of read commands that share a data bus at any time. Initially sending the soft-bit information 30 may increase the traffic on the data bus and degrade the read latency of other reads. When multiple read commands share the same data bus, this additional delay is multiped by the number of those read commands. Accordingly, the latency savings from the illustrated solution may be significant.

Figure 3:
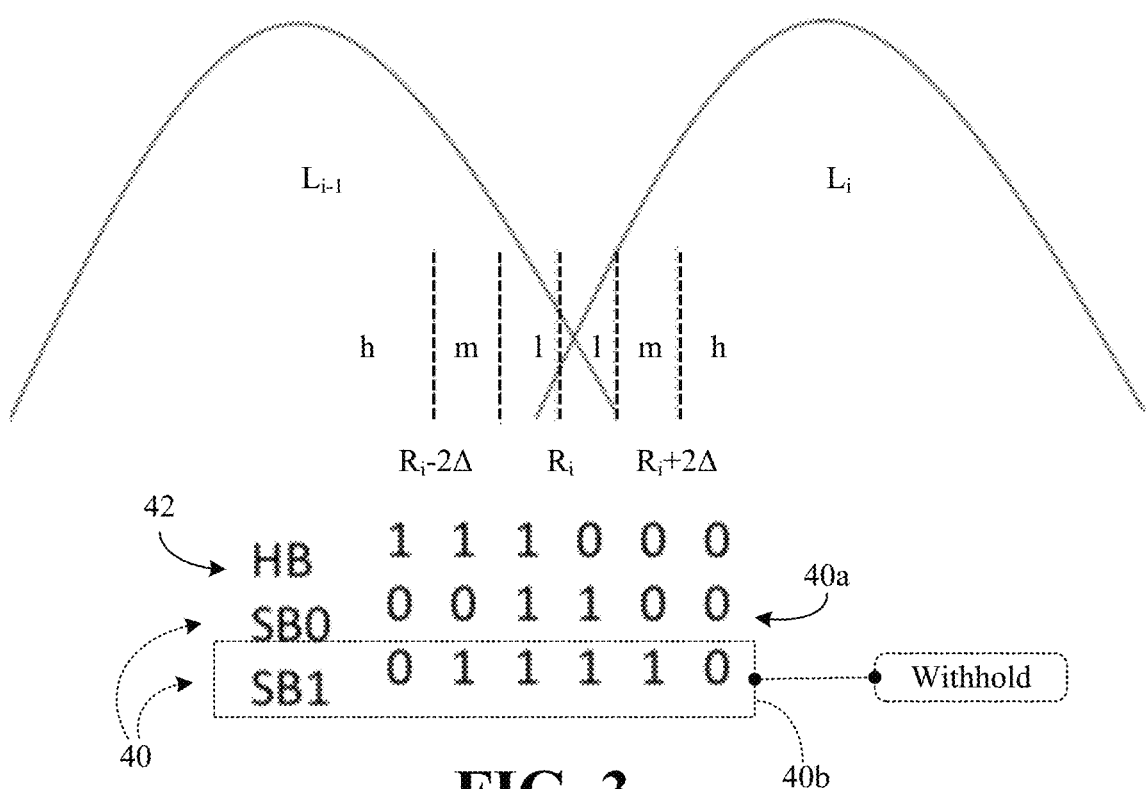
FIG. 3 is an illustration of an example of a 5-strobe soft-read according to an embodiment.

FIG. 3 demonstrates that the correction capability can further be improved by increasing the number of "buckets" for soft-bit information 40 (40a, 40b). In the illustrated example, a 5-strobe soft-read operation groups bits into three buckets of low, medium, and high confidence. More particularly, additional strobes are performed at $R_i-2\Delta$, $R_i-\Delta$, $R_i+\Delta$ and $R_i+2\Delta$. Thus, if a soft-read at the level $R_i-\Delta$ indicates that the cell is programmed to the encoding level $L_i$, it may be determined that a low confidence transition has taken place with respect to the bit in question. If a soft-read at the level $R_i-2\Delta$ indicates that the cell is programmed to the encoding level $L_i$, it may be determined that a medium ("m") confidence transition has taken place with respect to the bit in question. Otherwise, hard-bit information 42 is considered to be a high confidence value. Again, A may be chosen to maximize the information based on a trade-off between sensitivity and specificity. Additionally, Δ might be different for the 5-strobe soft-read than for a 3-strobe soft-read.

The illustrated four buckets are encoded by two bits of soft-bit information 40. More particularly, low and medium confidence bits are denoted by (SB0, SB1)=(1,1) and (0,1), respectively. In an embodiment, the soft-bit information 40 includes first soft-bit information 40a (SB0) and second soft-bit information 40b (SB1). In the illustrated example, the memory device initially sends the hard-bit information 42 and the first soft-bit information 40a (e.g., indicating low confidence bits) to the controller that initiated the reads and withholds the second soft-bit information 40b (e.g., indicating medium confidence bits) from the controller. In such a case, the controller conducts a first error correction on the hard-bit information 42 and the first soft-bit information 40a and issues a subsequent request for the second soft-bit information 40b only if the first error correction is unsuccessful.

Initially withholding the second soft-bit information 40b enhances performance at least to the extent that traffic on the data I/O bus and/or latency are reduced. Indeed, latency may be further reduced by initially withholding the first soft-bit information 40a in addition to the second soft-bit information 40b. For example, to transfer 64 KB of data plus parity bits at 1000 MT/s (mega transfers per second) takes roughly 75 microseconds, whereas the additional two bits of soft-bit information 40 may take an extra 150 microseconds to transfer.

Figure 4:
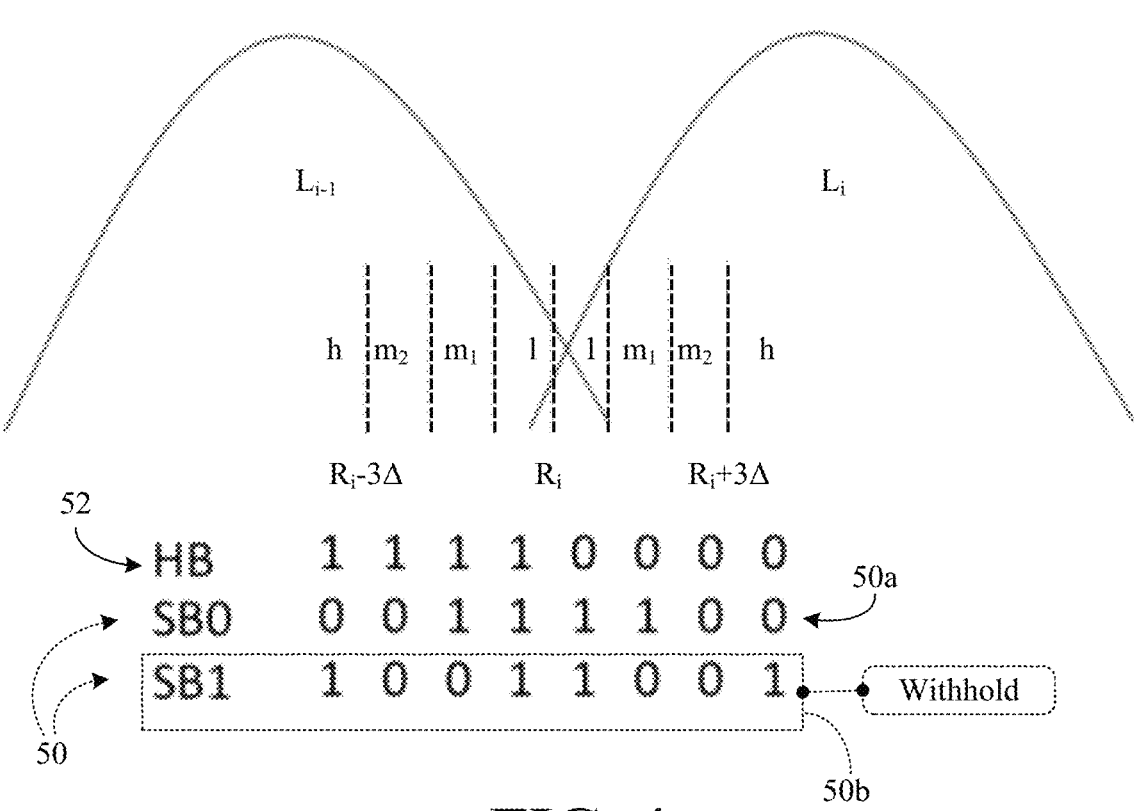
FIG. 4 is an illustration of an example of a 7-strobe soft-read according to an embodiment.

FIG. 4 demonstrates that the correction capability can further be improved by increasing the number of buckets for soft-bit information 50 (50a, 50b). In the illustrated example, a 7-strobe soft-read groups bits in to four buckets of low, medium$_1$ ("m$_1$"), medium$_2$ ("m$_{12}$"), and high confidence. More particularly, additional strobes are performed at $R_i-3\Delta$, $R_i-2\Delta$, $R_i-\Delta$, $R_i+\Delta$, $R_i+2\Delta$, and $R_i-3\Delta$. Thus, if a soft-read at the level $R_i-\Delta$ indicates that the cell is programmed to the encoding level $L_i$, it may be determined that a low confidence transition has taken place with respect to the bit in question. If a soft-read at the level $R_i-2\Delta$ indicates that the cell is programmed to the encoding level $L_i$, it may be determined that a medium$_1$ confidence transition has taken place with respect to the bit in question. If a soft-read at the level $R_i-3\Delta$ indicates that the cell is programmed to the encoding level $L_i$, it may be determined that a medium$_2$ confidence transition has taken place with respect to the bit in question. Otherwise, hard-bit information 52 is considered to be a high confidence value. Again, Δ may be chosen to maximize the information based on a trade-off between sensitivity and specificity. Additionally, Δ might be different than the value for a 3-strobe and/or 5-strobe soft-read.

The illustrated six buckets are encoded by two bits of soft-bit information 50. More particularly, low, medium$_1$ and medium$_2$ confidence bits are denoted by (SB0, SB1)=(1,1), (1,0), and (0,0) respectively. In an embodiment, the soft-bit information 50 includes first soft-bit information 50a (SB0) and second soft-bit information 50b (SB0). In the illustrated example, the memory device initially sends the hard-bit information 52 and the first soft-bit information 50a (e.g., indicating low and medium$_1$ confidence bits) to the controller that initiated the reads and withholds the second soft-bit information 50b (e.g., indicating medium confidence bits) from the controller. In such a case, the controller conducts a first error correction on the hard-bit information 52 and the first soft-bit information 50a and issues a subsequent request for the second soft-bit information 50b if the first error correction is unsuccessful. As already noted, initially withholding the second soft-bit information 50b enhances performance at least to the extent that traffic on the data I/O bus and/or latency reduced. Indeed, latency may be further reduced by initially withholding the first soft-bit information 50a in addition to the second soft-bit information 50b.

With continuing reference to FIGS. 2-4, sense operations at $R_i$ determine the hard-bit. Bits that change from 0 to 1 or vice versa between consecutive read voltages are identified as low or medium confidence bits. In an embodiment, the identification is accomplished by conducting a logic XOR operation between the result of consecutive reads. Some delay, however, may be needed between each read operation to ensure the wordline (WL) voltage and bitline (BL) currents are stable. Such an approach may add to the read time and degrade the read performance. For example, the read time for a 3-strobe soft-bit may be roughly three times longer than a read with no soft-bit information when the WL voltage is modulated.

Accordingly, instead of modulating the WL voltage in the vicinity of the read levels, embodiments keep the WL voltage at each read level and compare the BL current to different reference currents. This approach may be achieved by first precharging a sensing capacitor and then allowing the BL current to discharge the sensing capacitor for a given time $t_{sense}$. Then, the voltage across the capacitor is compared against a reference voltage $V_{ref}$ to determine which bit is read as zero or one. To compare the BL current against different reference currents, the reference voltage $V_{ref}$ may be modulated. Alternatively, a boost voltage may be applied to the backside of the sensing capacitor prior to comparing the voltage while the sensing capacitor is isolated from other circuits. Additionally, multi-strobes may be performed by modulating the time allowed to discharge the sensing capacitor (e.g., $t_{sense}$). In any of these implementations, since the WL voltage is unchanged, there is no need to wait for WL and BL to stabilize and hence soft-bit reads can be performed in a time close to a normal read.

Figure 5:
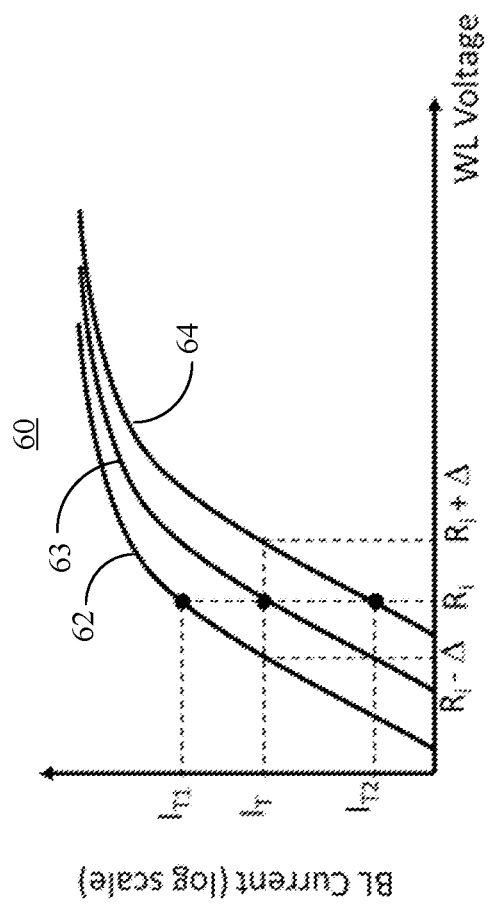
FIG. 5 is a plot of an example of a current-voltage (I-V) graph associated with a selection of reference current values for a read operation according to an embodiment.

More particularly, FIG. 5 shows a graph 60 of a function associated with selection of BL reference currents or values ("reference currents"), in accordance with various embodiments. In embodiments, first, second, and third reference currents are used to compare the threshold voltage of the cells against first, second, and third read reference voltages at a single shared WL voltage level. As shown, the current level of a memory cell (Icell) is schematically depicted vertically and a corresponding WL voltage ($V_{WL}$) is schematically depicted horizontally. For the embodiment, respective curves 62, 63 and 64 represent current-voltage ("I-V") characteristics of respective memory cells. As illustrated, comparing the cell current against three reference currents $I_{T1}$, $I_T$, and $I_{T2}$, the WL voltage at a single reference voltage $R_i$ is equivalent to comparing the cells at a constant reference current $I_T$ but at different reference read voltages $R_i-\Delta$, $R_i$, and $R_i+\Delta$.

In embodiments where the current-voltage characteristics of the cells can be represented by an exponential equation, the memory cell corresponding to curve 62 is read at $$I_{T1} = I_T 10^{\left(\frac{\Delta}{S}\right)}$$

while the memory cell corresponding to curve 64 is read at $$I_{T2} = I_T 10^{\left(\frac{\Delta}{S}\right)}$$

where S is the subthreshold slope of the memory cells and $I_{T1}$, $I_T$, $I_{T2}$, are BL reference currents. In general, other suitable reference currents $I_{T1}$, $I_T$, $I_{T2}$ can be used based on the current-voltage characteristics of the cells. Accordingly, in embodiments, when memory cells are verified at a single or shared read voltage level, the memory cells are read at different reference currents such as, for example, $I_{T1}$, $I_T$, and $I_{T2}$, respectively.

Figure 6:
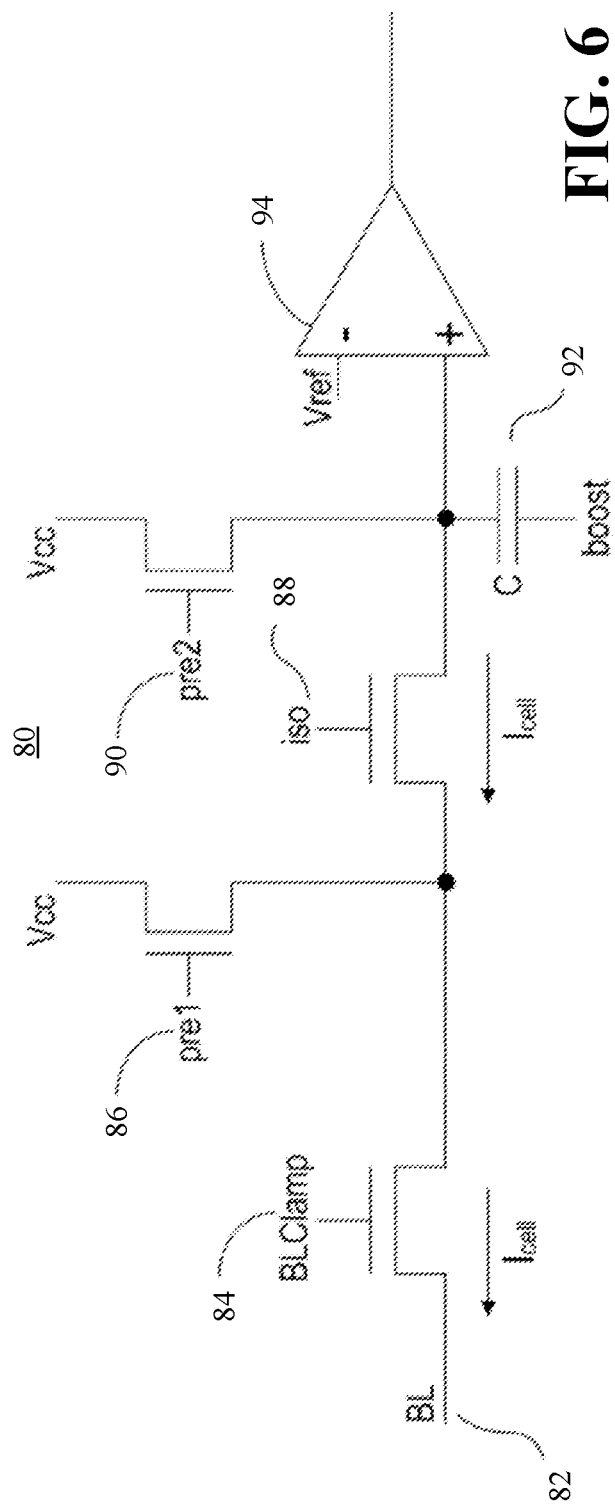
FIG. 6 is a schematic diagram of an example of a sense circuit associated with read operations according to an embodiment.

FIG. 6 shows an example sense circuit 80 in accordance with various embodiments. In embodiments, the sense circuit 80 compares a BL current to a plurality of different BL reference current levels. As illustrated, the sense circuit 80 is coupled to a BL 82 and includes a transistor 84 ("BLClamp") coupled to a first precharge transistor 86 ("pre1") and a second precharge transistor 90 ("pre2"). In embodiments, an isolation transistor 88 ("iso") is coupled between the first and second precharge transistors 86, 90 while a sense capacitor 92 ("C") is coupled to the isolation transistor 88, the second precharge transistor 90, and an input to a voltage comparator 94. In embodiments, control circuitry of a memory array includes the sense circuit 80 to compare a voltage level on the sense capacitor 92 to a shared verify voltage level ($V_{ref}$) to determine whether a first BL current is larger than a first reference BL current. Accordingly, in embodiments, a combination of performing sense operations using a different on-time or $t_{sense}$ for the isolation transistor 88 and subtracting a voltage from $V_{ref}$ by applying a non-zero boost voltage to the bottom terminal of the sense capacitor 92 is used to compare the memory cell current against a plurality of reference currents (e.g., $I_{T1}$, $I_{T2}$, and $I_{T3}$).

Figure 7:
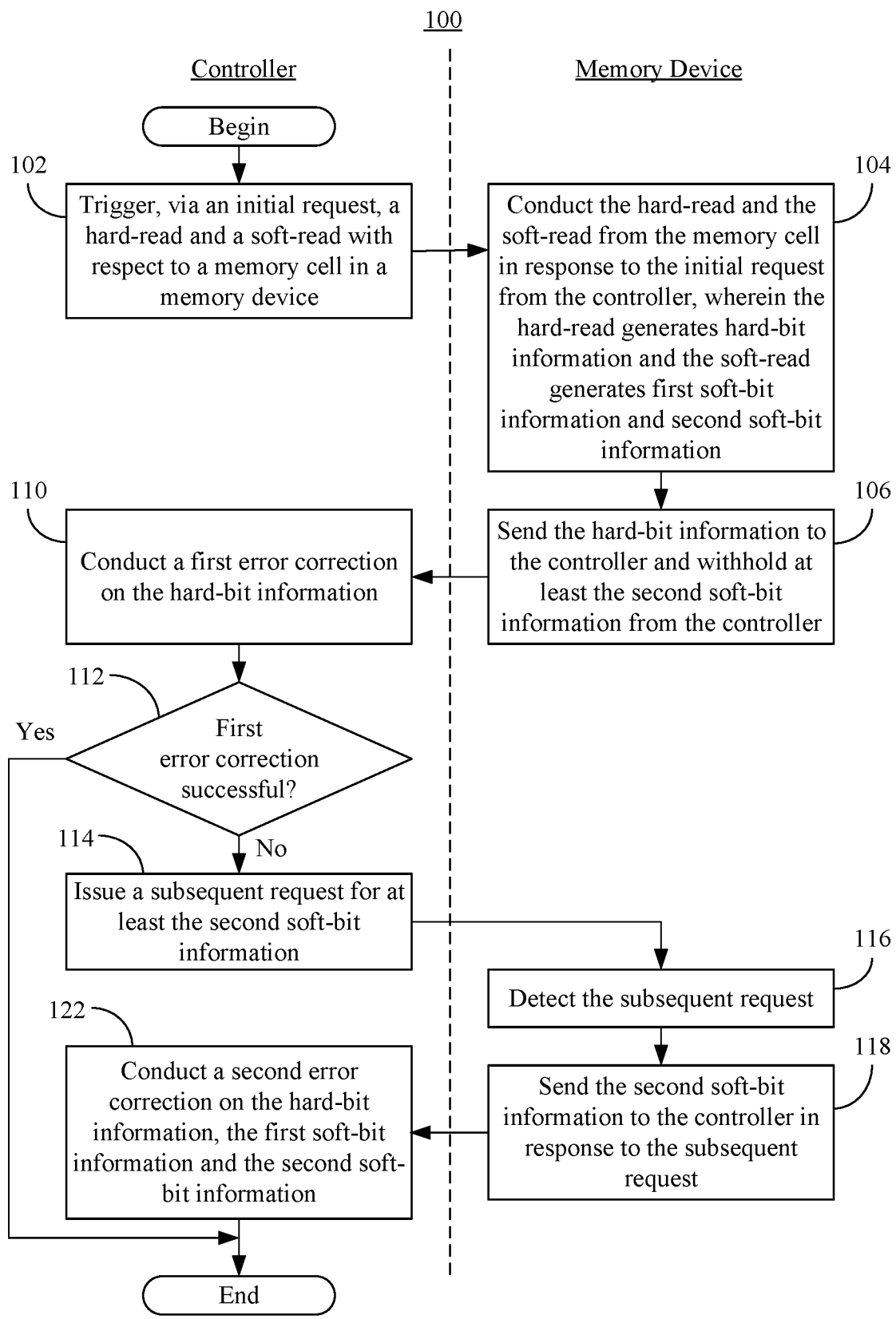
FIG. 7 is a flowchart of an example of a method of operating a controller and a memory device according to an embodiment.

FIG. 7 shows a method 100 of operating a controller (e.g., chip controller apparatus) and a memory device (e.g., MLC NAND). The method 100 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), FPGAS, complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

Illustrated controller processing block 102 triggers, via an initial request, a hard-read and a soft-read with respect to a memory cell in the memory device. The soft-read may be a 5-strobe soft-read, a 7-strobe soft-read, and so forth. In an embodiment, memory device block 104 conducts the hard-read and the soft-read from the memory cell in response to the initial request from the controller, wherein the hard-read generates hard-bit information and the soft-read generates first soft-bit information (e.g., SB0) and second soft-bit information (e.g., SB1). Memory controller block 106 sends the hard-bit information to the controller and withholds at least the second soft-bit information from the controller. Block 106 may include storing at least the second soft-bit information (and potentially the first soft-bit information) locally on the memory device while the hard-bit information is being processed by the controller. In one example, block 106 also sends the first soft-bit information with the hard-bit information to the controller. Additionally, block 106 may send the hard-bit information (and potentially the first soft-bit information) to the controller via a shared bus (e.g., shared I/O bus).

Controller block 110 conducts a first error correction on the hard-bit information (e.g., via an ECC engine based on data and parity bits). In an embodiment, block 110 excludes the second soft-bit information from the first error correction. Additionally, block 110 may conduct the first error correction further on the first soft-bit information. A determination is made at controller block 112 as to whether the first error correction was successful. In some embodiments, controller block 112 may determine that the error correction was not successful after a prescribed time such as 1 microsecond has elapsed, and the error correction circuit was not able to finish its operation. If not, controller block 114 issues a subsequent request for at least the second soft-bit information. In an embodiment, block 114 includes storing the hard-bit information (and potentially the first soft-bit information) locally on the controller (e.g., in static RAM/SRAM or dynamic RAM/DRAM) until at least the second soft-bit information is received from the memory device. Memory device block 116 detects the subsequent request 116 and memory device block 118 sends at least the second soft-bit information to the controller in response to the subsequent request. Memory device block 118 may also send the first soft-bit information to the controller.

In an embodiment, controller block 122 conducts a second error correction (e.g., via an ECC engine based on data and parity bits) on the hard-bit information, the first soft-bit information, and the second soft-bit information. If it is determined at controller block 112 that the first error correction was successful, the illustrated method 100 bypasses blocks 114, 116, 118 and 122, and terminates. As already noted, the controller may obtain the hard-bit information, the first soft-bit information, and the second soft-bit information from a shared bus. The method 100 therefore enhances performance at least to the extent that initially withholding soft-bit information from the controller reduces latency and enables progressive data output. Indeed, in the case where HB and SB0 are enough for error correction, latency may be improved by nearly 30% compared to the case where HB, SB0 and SB1 are transmitted over the bus. Additionally, since the SB1 data has already been generated within the memory device, no extra delay other than the I/O time for SB1 is encountered.

The memory device may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Figure 8:
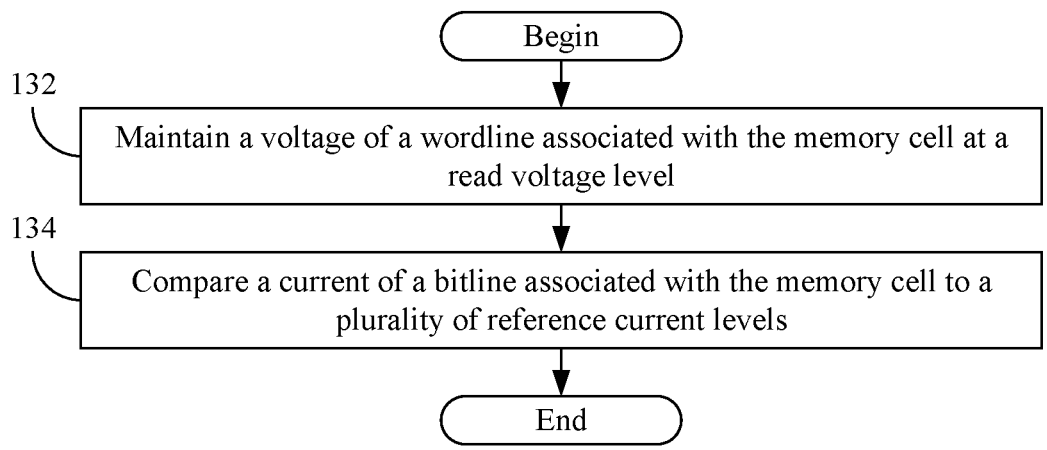
FIG. 8 is a flowchart of an example of a method of conducting hard-reads and soft-reads according to an embodiment.

FIG. 8 shows a method 130 of conducting hard-reads and soft-reads. The method 1130 may generally be incorporated into block 104 (FIG. 7), already discussed. More particularly, the method 130 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 132 provides for maintaining a voltage of a wordline associated with a memory cell at a read voltage level. In an embodiment, block 134 compares a current of a bitline associated with the memory cell to a plurality of reference current levels. The method 130 therefore further enhances performance and/or quality of service (QOS) by eliminating any need to wait for the wordline and bitline to stabilize when conducting read operations (e.g., since the wordline voltage is unchanged). Indeed a soft-bit read operation may be performed in an amount of time close to a normal read.

Figure 9:
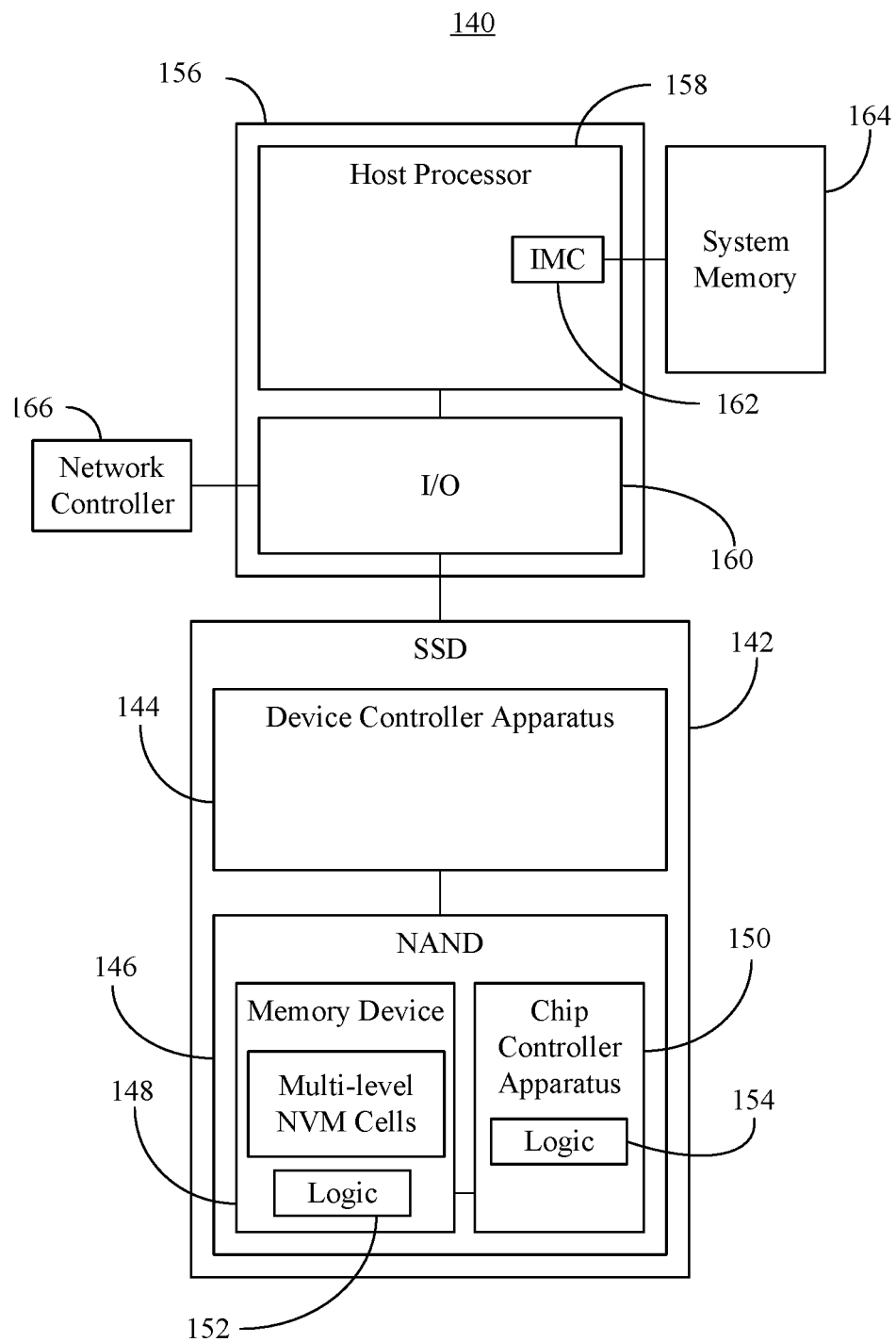
FIG. 9 is a block diagram of an example of a performance-enhanced computing system according to an embodiment.

Turning now to FIG. 9, a performance-enhanced computing system 140 is shown. In the illustrated example, a solid state drive (SSD) 142 includes a device controller apparatus 144 that is coupled to a NAND 146. The illustrated NAND 146 includes a memory device 148 having a set of multi-level NVM cells and logic 152 (e.g., transistor array and other integrated circuit/IC components coupled to one or more substrates containing silicon, sapphire and/or gallium arsenide), and a chip controller apparatus 150 that includes logic 154. The logic 152, which may include one or more of configurable or fixed-functionality hardware, may be configured to perform one or more aspects of the method 100 (FIG. 7) and/or the method 130 (FIG. 8), already discussed. Additionally, the logic 154, which may also include one or more of configurable or fixed-functionality hardware, may be configured to perform one or more aspects of the method 100 (FIG. 7), already discussed.

Thus, the logic 154 triggers, via an initial request, a hard-read and a soft-read with respect to a memory cell in the memory device 148, wherein the hard-read generates hard-bit information and the soft-read generates first soft-bit information and second soft-bit information. The logic 154 also conducts a first error correction on the hard-bit information and issues a subsequent request for at least the second soft-bit information if the first error correction is unsuccessful.

The logic 152 conducts the hard-read and the soft-read from a memory cell in the plurality of memory cells in response to the initial request from the chip controller apparatus 150. The logic 152 also sends the hard-bit information to the controller and withholds at least the second soft-bit information from the chip controller apparatus 150 until the subsequent request is received.

The illustrated system 140 also includes a system on chip (SoC) 156 having a host processor 158 (e.g., central processing unit/CPU) and an input/output (I/O) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

Figure 10:
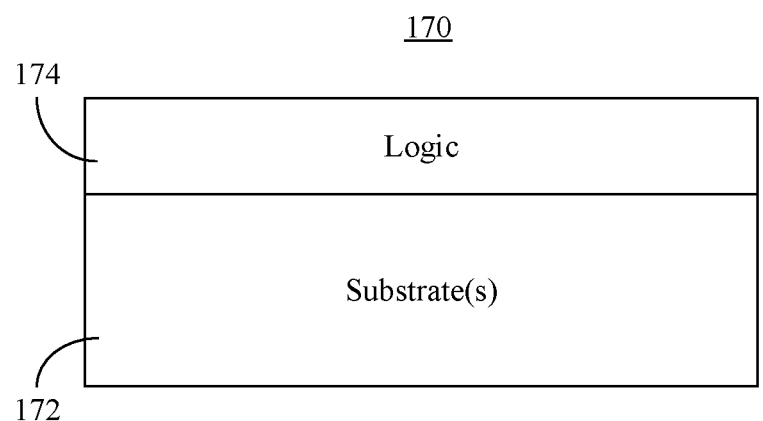
FIG. 10 is an illustration of an example of semiconductor apparatus according to an embodiment.

FIG. 10 shows a semiconductor apparatus 170 (e.g., chip, die) that includes one or more substrates 172 and logic 174 coupled to the substrate(s). The logic 174 may be readily substituted for the logic 152 (FIG. 9) and/or the logic 154 (FIG. 9). In one example, the logic 174 includes transistor channel regions that are positioned (e.g., embedded) within the substrate 172. Thus, the interface between the logic 174 and the substrate(s) may not be an abrupt junction. The logic 174 may also be considered to include an epitaxial layer that is grown on an initial wafer of the substrate 172.

Additional Notes and Examples

Example 1 includes a memory device comprising a plurality of memory cells and logic coupled to one or more substrates, the logic to conduct a hard-read and a soft-read from a memory cell in the plurality of memory cells in response to an initial request from a controller, wherein the hard-read is to generate hard-bit information and the soft-read is to generate first soft-bit information and second soft-bit information, send the hard-bit information to the controller, and withhold at least the second soft-bit information from the controller.

Example 2 includes the memory device of Example 1, wherein the logic is further to detect a subsequent request from the controller, and send the second soft-bit information to the controller in response to the subsequent request.

Example 3 includes the memory device of Example 1, wherein the logic is further to send the first soft-bit information with the hard-bit information to the controller.

Example 4 includes the memory device of Example 1, wherein the soft-read is to be one or more of a 5-strobe soft-read or a 7-strobe soft-read.

Example 5 includes the memory device of Example 1, wherein the logic is further to store at least the second soft-bit information locally on the memory device while the hard-bit information is being processed by the controller.

Example 6 includes the memory device of Example 1, wherein the hard-bit information is to be sent to the controller via a shared bus.

Example 7 includes the memory device of any one of Examples 1 to 6, wherein to conduct the hard-read and the soft-read, the logic is further to maintain a voltage of a wordline associated with the memory cell at a read voltage level, and compare a current of a bitline associated with the memory cell to a plurality of reference current levels.

Example 8 includes a memory chip controller comprising one or more substrates, and logic coupled to the one or more substrates, wherein the logic is implemented at least partly in one or more of configurable or fixed-functionality hardware logic, the logic coupled to the one or more substrates to trigger, via an initial request, a hard-read and a soft-read with respect to a memory cell in a memory device, wherein the hard-read is to generate hard-bit information and the soft-read is to generate first soft-bit information and second soft-bit information, conduct a first error correction on the hard-bit information, and issue a subsequent request for at least the second soft-bit information if the first error correction is unsuccessful.

Example 9 includes the memory chip controller of Example 8, wherein the logic coupled to the one or more substrates is further to conduct a second error correction on the hard-bit information, the first soft-bit information, and the second soft-bit information.

Example 10 includes the memory chip controller of Example 9, wherein the logic coupled to the one or more substrates is further to obtain the hard-bit information, the first soft-bit information, and the second soft-bit information from a shared bus.

Example 11 includes the memory chip controller of Example 8, wherein the logic coupled to the one or more substrates is further to exclude the second soft-bit information from the first error correction.

Example 12 includes the memory chip controller of Example 8, wherein the first error correction is conducted further on the first soft-bit information.

Example 13 includes the memory chip controller of Example 8, wherein the soft-read is to be one or more of a 5-strobe soft-read or a 7-strobe soft-read.

Example 14 includes the memory chip controller of any one of Examples 8 to 13, wherein the logic coupled to the one or more substrates is to store the hard-bit information locally on the controller until at least the second soft-bit information is received from the memory device.

Example 15 includes a performance-enhanced computing system comprising a memory chip controller including first logic to trigger, via an initial request, a hard-read and a soft-read, wherein the hard-read is to generate hard-bit information and the soft-read is to generate first soft-bit information and second soft-bit information, conduct a first error correction on the hard-bit information, and issue a subsequent request for at least the second soft-bit information if the first error correction is unsuccessful, and a memory device including a plurality of memory cells and second logic to conduct the hard-read and the soft-read from a memory cell in the plurality of memory cells in response to the initial request, send the hard-bit information to the controller, and withhold at least the second soft-bit information from the controller until the subsequent request is received.

Example 16 includes the computing system of Example 15, wherein the first logic is to conduct a second error correction on the hard-bit information, the first soft-bit information, and the second soft-bit information.

Example 17 includes the computing system of Example 15, wherein the first logic is to obtain the hard-bit information, the first soft-bit information, and the second soft-bit information from a shared bus.

Example 18 includes the computing system of Example 15, wherein the first error correction is conducted further on the first soft-bit information.

Example 19 includes the computing system of Example 15, wherein to conduct the hard-read and the soft-read, the second logic is further to maintain a voltage of a wordline associated with the memory cell at a read voltage level, and compare a current of a bitline associated with the memory cell to a plurality of reference current levels.

Example 20 includes the computing system of any one of Examples 15 to 19, wherein the soft-read is to be one or more of a 5-strobe soft-read or a 7-strobe soft-read.

Example 21 includes a method of operating a memory device, the method comprising conducting a hard-read and a soft-read from a memory cell in a plurality of memory cells in response to an initial request from a controller, wherein the hard-read generates hard-bit information and the soft-read generates first soft-bit information and second soft-bit information, sending the hard-bit information to the controller, and withholding at least the second soft-bit information from the controller.

Example 22 includes a method of operating a memory chip controller, the method comprising triggering, via an initial request, a hard-read and a soft-read with respect to a memory cell in a memory device, wherein the hard-read generates hard-bit information and the soft-read generates first soft-bit information and second soft-bit information, conducting a first error correction on the hard-bit information, and issuing a subsequent request for at least the second soft-bit information if the first error correction is unsuccessful.

Example 23 includes means for performing the method of any one of Examples 21 to 22.

Technology described herein therefore enables a NAND to internally perform soft read operations with a maximum number of buckets for which the NAND is designed (e.g., 7-strobes), with soft-bit information being output progressively. An SSD controller may begin by requesting hard-bit information and 1-bit of soft-bit information. Additional soft-bit information is only requested when the ECC engine fails to correct the data with partial soft-bit information.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory device comprising:
a plurality of memory cells; and
logic coupled to one or more substrates, the logic to:
conduct a hard-read and a soft-read from a memory cell in the plurality of memory cells in response to an initial request from a controller, wherein the hard-read is to generate hard-bit information and the soft-read is to generate first soft-bit information and second soft-bit information;
send the hard-bit information to the controller;
send the first soft-bit information with the hard-bit information to the controller while withholding at least the second soft-bit information from the controller;
detect a subsequent request from the controller; and
send the second soft-bit information to the controller in response to the subsequent request.

2. The memory device of claim 1, wherein the soft-read is to be one or more of a 5-strobe soft-read or a 7-strobe soft-read.

3. The memory device of claim 1, wherein the logic is further to store at least the second soft-bit information locally on the memory device while the hard-bit information is being processed by the controller.

4. The memory device of claim 1, wherein the hard-bit information is to be sent to the controller via a shared bus.

5. The memory device of claim 1, wherein to conduct the hard-read and the soft-read, the logic is further to:
maintain a voltage of a wordline associated with the memory cell at a read voltage level; and
compare a current of a bitline associated with the memory cell to a plurality of reference current levels.

6. A memory chip controller comprising:
one or more substrates; and
logic coupled to the one or more substrates, wherein the logic is implemented at least partly in one or more of configurable or fixed-functionality hardware logic, the logic coupled to the one or more substrates to:
trigger, via an initial request, a hard-read and a soft-read with respect to a memory cell in a memory device, wherein the hard-read is to generate hard-bit information and the soft-read is to generate first soft-bit information and second soft-bit information;

conduct a first error correction on the hard-bit information; and issue a subsequent request for at least the second soft-bit information if the first error correction is unsuccessful.

7. The memory chip controller of claim 6, wherein the logic coupled to the one or more substrates is further to conduct a second error correction on the hard-bit information, the first soft-bit information, and the second soft-bit information.

8. The memory chip controller of claim 7, wherein the logic coupled to the one or more substrates is further to obtain the hard-bit information, the first soft-bit information, and the second soft-bit information from a shared bus.

9. The memory chip controller of claim 6, wherein the logic coupled to the one or more substrates is further to exclude the second soft-bit information from the first error correction.

10. The memory chip controller of claim 6, wherein the first error correction is conducted further on the first soft-bit information.

11. The memory chip controller of claim 6, wherein the soft-read is to be one or more of a 5-strobe soft-read or a 7-strobe soft-read.

12. The memory chip controller of claim 6, wherein the logic coupled to the one or more substrates is to store the hard-bit information locally on the controller until at least the second soft-bit information is received from the memory device.

13. A computing system comprising:
a memory chip controller including first logic to:
trigger, via an initial request, a hard-read and a soft-read, wherein the hard-read is to generate hard-bit information and the soft-read is to generate first soft-bit information and second soft-bit information,
conduct a first error correction on the hard-bit information, and
issue a subsequent request for at least the second soft-bit information if the first error correction is unsuccessful; and
a memory device including a plurality of memory cells and second logic to:
conduct the hard-read and the soft-read from a memory cell in the plurality of memory cells in response to the initial request,
send the hard-bit information to the controller; and
withhold at least the second soft-bit information from the controller until the subsequent request is received.

14. The computing system of claim 13, wherein the first logic is to conduct a second error correction on the hard-bit information, the first soft-bit information, and the second soft-bit information.

15. The computing system of claim 13, wherein the first logic is to obtain the hard-bit information, the first soft-bit information, and the second soft-bit information from a shared bus.

16. The computing system of claim 13, wherein the first error correction is conducted further on the first soft-bit information.

17. The computing system of claim 13, wherein to conduct the hard-read and the soft-read, the second logic is further to:
maintain a voltage of a wordline associated with the memory cell at a read voltage level, and
compare a current of a bitline associated with the memory cell to a plurality of reference current levels.

18. The computing system of claim 13, wherein the soft-read is to be one or more of a 5-strobe soft-read or a 7-strobe soft-read.

* * * * *